United States Patent
Kim et al.

(10) Patent No.: US 9,443,705 B2
(45) Date of Patent: Sep. 13, 2016

(54) MULTIPLE FREQUENCY RF AMPLIFIER, MASS SPECTROMETER INCLUDING THE SAME, AND MASS SPECTROMETRY METHOD OF MASS SPECTROMETER

(71) Applicant: Korea Basic Science Institute, Cheongju-si, Chungcheongbuk-do (KR)

(72) Inventors: Seung Yong Kim, Daejeon (KR); Mo Yang, Daejeon (KR); Hyun Sik Kim, Daejeon (KR)

(73) Assignee: Korea Basic Science Institute, Chungcheongbuk-Do (KR)

( * ) Notice: Subject to any disclaimer, the term of this patent is extended or adjusted under 35 U.S.C. 154(b) by 0 days.

(21) Appl. No.: 14/851,401

(22) Filed: Sep. 11, 2015

(65) Prior Publication Data
US 2016/0079046 A1 Mar. 17, 2016

(30) Foreign Application Priority Data
Sep. 11, 2014 (KR) .................. 10-2014-0120408

(51) Int. Cl.
*H01J 49/00* (2006.01)
*H01J 49/02* (2006.01)
*H01J 49/42* (2006.01)

(52) U.S. Cl.
CPC .......... *H01J 49/0022* (2013.01); *H01J 49/022* (2013.01); *H01J 49/427* (2013.01)

(58) Field of Classification Search
USPC ................................ 250/281, 282
See application file for complete search history.

(56) References Cited

U.S. PATENT DOCUMENTS

| | | | |
|---|---|---|---|
| 4,221,964 A | 9/1980 | Schlereth et al. | |
| 5,457,315 A | 10/1995 | Wells et al. | |
| 7,973,277 B2 | 7/2011 | Rafferty | |
| 8,487,249 B2* | 7/2013 | Gershman | H01J 49/4275 250/282 |
| 2009/0294657 A1 | 12/2009 | Rafferty | |
| 2014/0183350 A1* | 7/2014 | Brown | H01J 49/0031 250/282 |
| 2014/0183355 A1* | 7/2014 | Bartfay-Szabo | H01J 49/24 250/290 |

FOREIGN PATENT DOCUMENTS

| | | |
|---|---|---|
| KR | 10-0575458 B1 | 5/2006 |
| KR | 10-1383264 B1 | 4/2014 |

OTHER PUBLICATIONS

Kim, SeungYong. "Design and Implementation of Portable Mass Spectrometer for Reduced Power Dissipation." Master's Thesis, Department of Computing, Graduate School of Soongsil University, 2013.

* cited by examiner

*Primary Examiner* — Kiet T Nguyen
(74) *Attorney, Agent, or Firm* — Harness, Dickey & Pierce, P.L.C.

(57) ABSTRACT

Provided is a multiple frequency Radio Frequency (RF) amplifier. The multiple frequency RF amplifier includes a waveform generation circuit configured to generate an RF signal by amplitude and frequency-modulating a reference waveform signal, a drive amplifier circuit configured to drive-amplify the RF signal, and a power amplifier circuit configured to generate a multiple frequency RF voltage signal through a power amplification of the drive-amplified RF signal and output the multiple frequency RF voltage signal to an ion trap for a mass spectrometry.

11 Claims, 3 Drawing Sheets

MULTIPLE FREQUENCY RF AMPLIFIER, MASS SPECTROMETER INCLUDING THE SAME, AND MASS SPECTROMETRY METHOD OF MASS SPECTROMETER

CROSS-REFERENCE TO RELATED APPLICATIONS

This U.S. non-provisional patent application claims priority under 35 U.S.C. §119 of Korean Patent Application No. 10-2014-0120408, filed on Sep. 11, 2014, the entire contents of which are hereby incorporated by reference.

BACKGROUND

The present disclosure herein relates to a mass spectrometry method of a portable mass spectrometer, and more particularly, to a portable multiple frequency RF amplifier operable with low power, a mass spectrometer including the same, and a mass spectrometry method of the mass spectrometer.

A mass spectrometer may have a function for separating ionized molecules having a mass and different charge ratios and may measure an ion current of each molecule. Additionally, the mass spectrometer may be classified in various forms according to a method of separating ions.

As one of such mass spectrometers, there is a mass spectrometer for analyzing mass by using an ion trap. At this point, in order to perform a mass spectrometry with an ion trap of a mass spectrometer, Radio Frequency (RF) voltage may be applied.

RF voltage is required to be increased in a mass spectrometer in order to increase a mass range. However, in order to increase RF voltage in such a way, power consumption is increased and the size of an RF amplifier becomes larger. If a mass spectrometer is implemented as a portable mass spectrometer to carry, as the increase of RF voltage increases power consumption, a battery capacity is increased and as the size is increased, it is difficult to manufacture the portable mass spectrometer.

Additionally, a mass spectrometer may fix RF voltage and change frequency in order to increase a mass range. For this, a mass spectrometer may use a wideband amplifier. However, as a wideband amplifier is heavy and requires an additional matching circuit, it is difficult to implement a mass spectrometer using the wideband amplifier as a portable device.

SUMMARY

The present disclosure provides a multiple frequency RF amplifier operable with low power and a mass spectrometry method of a mass spectrometer including the multiple RF amplifier.

The present disclosure also provides a multiple frequency RF amplifier in a portable form and a mass spectrometry method of a mass spectrometer including the multiple frequency RF amplifier.

An embodiment of the inventive concept provides multiple frequency Radio Frequency (RF) amplifiers including: a waveform generation circuit configured to generate an RF signal by amplitude and frequency-modulating a reference waveform signal; a drive amplifier circuit configured to drive-amplify the RF signal; and a power amplifier circuit configured to generate a multiple frequency RF voltage signal through a power amplification of the drive-amplified RF signal and output the multiple frequency RF voltage signal to an ion trap for a mass spectrometry.

In an embodiment, the multiple frequency RF amplifiers may further include: a waveform rectifier circuit configured to rectify a waveform of the power-amplified multiple frequency RF voltage signal; and a waveform compensation circuit configured to compensate a waveform of the RF signal outputted from the waveform generation circuit.

In an embodiment, the waveform generation circuit may increase an amplitude of the RF signal and may reduce a frequency of the RF signal to expand a range of the mass spectrometry.

In an embodiments of the inventive concept, a mass spectrometer includes: an electron generator configured to generate an electron used as an ion source; a multiple frequency Radio Frequency (RF) amplifier configured to generate a multiple frequency RF voltage signal by simultaneously modulating an amplitude and a frequency of a reference waveform signal; an ion trap configured to release an ion molecule generated by colliding the electrode with an injected sample to the outside according to a mass by using the multiple frequency RF voltage signal; a detector configured to detect the released ion; and a data analyzer configured to mass-analyze the detected ion.

In an embodiment, the multiple frequency RF amplifier may include: a waveform generation circuit configured to an RF signal from the reference waveform signal by simultaneously modulating the amplitude and the frequency; a drive amplifier circuit configured to drive-amplify the RF signal; and a power amplifier circuit configured to generate a multiple frequency RF voltage signal through a power amplification of the drive-amplified RF signal and output the multiple frequency RF voltage signal to the ion trap.

In an embodiment, the multiple frequency RF amplifier may include: a waveform rectifier circuit configured to rectify a waveform of the multiple frequency RF voltage signal; and a waveform compensation circuit configured to compensate a waveform of the RF signal outputted from the waveform generation circuit on the basis of the rectified waveform.

In an embodiment, the waveform generation circuit may increase an amplitude of the RF signal and may reduce a frequency of the RF signal to expand a range of the mass spectrometry.

In an embodiments of the inventive concept, a mass spectrometry method of a mass spectrometer includes: generating an electron used as an ion source; generating an ion molecule by colliding the generated electrode with an injected sample in an ion trap; generating a multiple frequency Radio Frequency (RF) voltage signal by modulating an amplitude and a frequency of a reference waveform signal; releasing the ion molecule to the outside of the ion trap according to a mass by using the multiple frequency RF voltage signal; detecting the released ion; and mass-analyzing the detected ion.

In an embodiment, the generating of the multiple frequency RF voltage signal may include: generating an RF signal by amplitude and frequency-modulating a reference waveform signal; drive-amplifying the RF signal; and generating the multiple frequency RF voltage signal by power-amplifying the drive-amplified RF signal and outputting the multiple frequency RF voltage signal to the ion trap.

In an embodiment, the generating of the RF signal may include: increasing an amplitude of an RF signal through the amplitude modulation; and reducing a frequency of an RF signal through the frequency modulation, wherein a range of the mass spectrometry is expanded through the amplitude increase and the frequency reduction.

In an embodiment, the generating of the multiple frequency RF voltage signal may include: rectifying a waveform of the multiple frequency RF voltage signal; and compensating a waveform of the RF signal on the basis of the rectified waveform.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Hereinafter, preferred embodiments of the inventive concept will be described in more detail with reference to the accompanying drawings. In the description below, it should be noted that only parts necessary for understanding operations according to the inventive concept are described and descriptions of other parts are omitted not to obscure the scope of the inventive concept.

Figure 1:
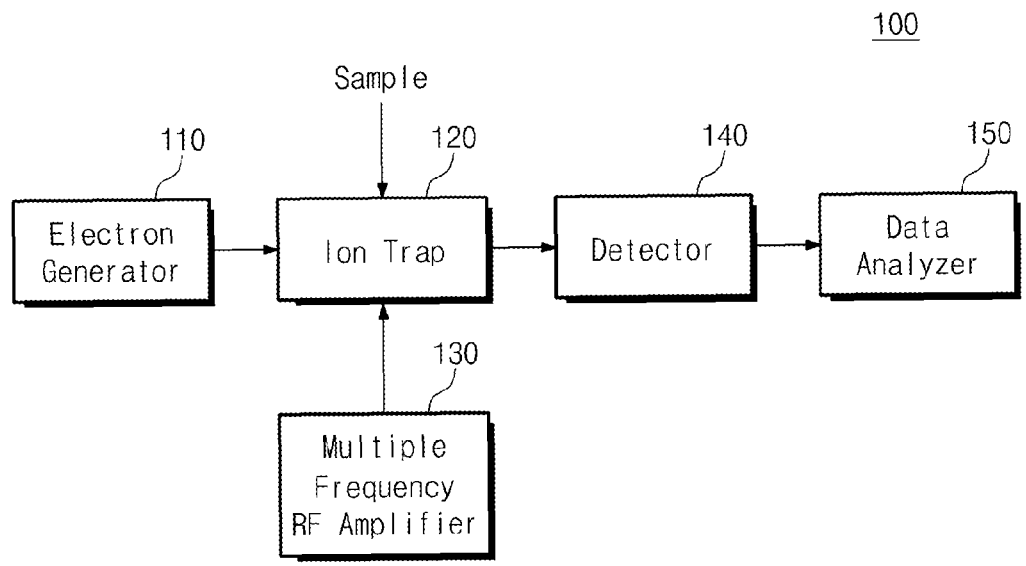
FIG. 1 is a view illustrating a mass spectrometer according to an embodiment of the inventive concept.

FIG. 1 is a view illustrating a mass spectrometer according to an embodiment of the inventive concept.

Referring to FIG. 1, a mass spectrometer 100 includes an electron generator 110, an ion trap 120, a multiple frequency Radio Frequency (RF) amplifier 130, a detector 140, and a data analyzer 150.

The electron generator 110 generates electrons used as an ion source. Through this, the electrons generated from the electron generator 110 are injected to the ion trap 120 and collide with an already injected sample that is to be analyzed in order to generate ion molecules. Herein, the injected sample may include various forms such as solid, liquid, and gaseous forms.

The ion trap 120 provides a space for confining ion molecules, and separates the ion molecules from the outside according to mass to release them. For example, the ion trap 120 receives a multiple frequency RF voltage signal and releases ion molecules to the outside in response to the multiple frequency RF voltage signal.

The multiple frequency RF amplifier 130 may increase the magnitude of voltage through the amplitude modulation of a reference waveform signal to release molecules having a large mass value and may generate RF signals through a method of releasing molecules having a larger molecule mass by using a method of increasing a voltage magnitude again with a modulation to a low frequency. For example, the reference waveform signal may include a sine wave. Especially, the multiple frequency RF amplifier 130 may change an amplitude and a frequency with respect to the reference waveform signal.

Then, the multiple frequency RF amplifier 130 amplifies the voltage of an RF signal to generate a multiple frequency RF voltage signal.

A detailed structure of the multiple frequency RF amplifier 130 will be described below with reference to FIG. 2.

The detector 140 detects ion molecules released from the ion trap 120. The detector 140 outputs a detection result obtained by detecting ion molecules to the data analyzer 150.

The data analyzer 150 mass-analyzes the ion molecule by using the detection result of the ion molecule. For example, an analysis result received from the data analyzer 150 may be in a spectral form. The data analyzer 150 may measure the mass of an ionized sample through a spectrum analysis.

Moreover, the mass spectrometer 100 including the ion trap 120 may detect ionized molecules in the ion trap 120 according to Equation 1.

$$m = \frac{-8cV}{q_c r^2 \Omega^2} \qquad \text{[Equation 1]}$$

where m represents a mass value and V represents RF voltage. Herein, the mass value m and the RF voltage V have a proportional relationship. Accordingly, as the amplitude of an RF signal is increased by voltage amplification, a mass range is increased. Additionally, $q_c$ represents the total charge of ion molecules and r represents the diameter of an ion trap. e represents the electron charge ($1.6 \times 10^{-19}$).

Because of this, in order to implement the low power operable mass spectrometer 100 to carry, when the multiple frequency RF amplifier 130 reduces frequency to about ½ by using an inversely proportional relationship of the square value of Ω that is a frequency component and the mass value m, a mass range may be expanded about four times. Through this, a wideband RF amplifier for frequency scan may not be required.

The mass spectrometer 100 suggested in the inventive concept may expand a mass range with low power and may be implemented as a portable device to carry by simultaneously performing amplitude and frequency modulation on a waveform of an RF voltage signal provided into the inside of the ion trap 120.

Figure 2:
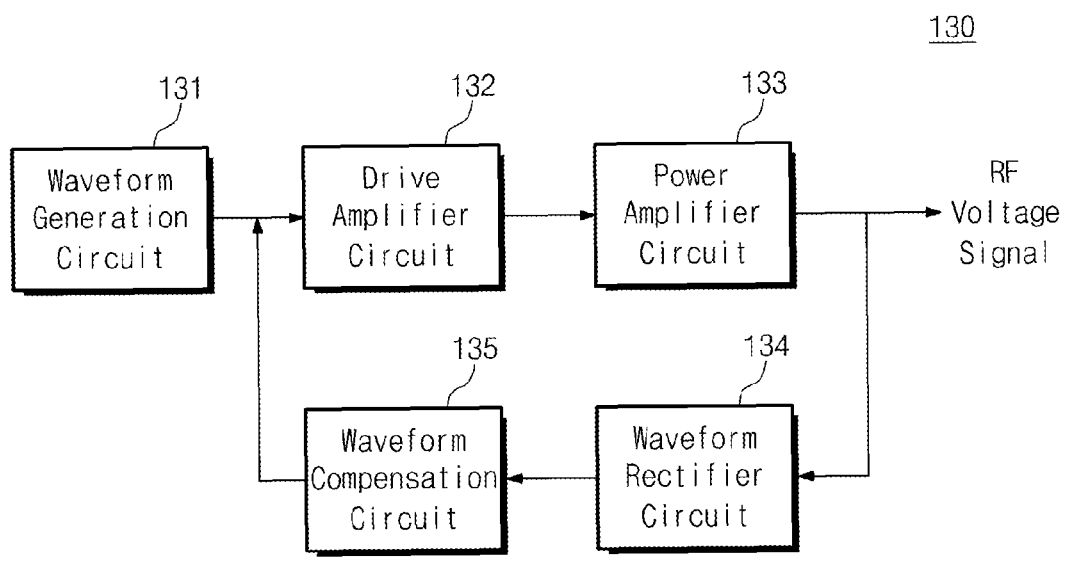
FIG. 2 is a view illustrating the multiple frequency RF amplifier shown in FIG. 1.

FIG. 2 is a view illustrating the multiple frequency RF amplifier shown in FIG. 1.

Referring to FIG. 2, the multiple frequency RF amplifier 130 includes a waveform generation circuit 131, a drive amplifier circuit 132, a power amplifier circuit 133, a waveform rectifier circuit 134, and a waveform compensation circuit 135.

The waveform generation circuit 131 performs amplitude modulation and frequency modulation on a reference waveform signal. The waveform generation circuit 131 may perform amplitude modulation and frequency modulation at the same time and generate RF signals through the amplitude modulation and the frequency modulation. The waveform generation circuit 131 outputs the generated RF signals to the drive amplifier circuit 132.

The drive amplifier circuit 132 drive-amplifies the RF signals. The drive amplifier circuit 132 adjusts the gain of RF signal in order to have a high gain at the front end of the power amplifier circuit 133. The drive amplifier circuit 132 outputs the drive-amplified RF signals to the power amplifier circuit 133.

The power amplifier circuit 133 amplifies the RF power of the drive-amplified RF signals to generate RF voltage signal.

The power amplifier circuit 133 amplifies the power of the RF signals by using an applied voltage. The power amplifier circuit 133 outputs the power-amplified multiple frequency RF voltage signals to the inside of the ion trap 120.

The waveform rectifier circuit 134 rectifies the waveform of an RF voltage signal outputted from the power amplifier circuit 133. The waveform rectifier circuit 134 outputs the rectified waveform to the waveform compensation circuit 135.

The waveform compensation circuit 135 generates a waveform compensation signal for compensating the RF signal of the waveform generation circuit 131 on the basis of the rectified waveform. The waveform compensation circuit 135 compensates the waveform of an RF signal outputted from the waveform generation circuit 131 by using the waveform compensation signal.

Figure 3:
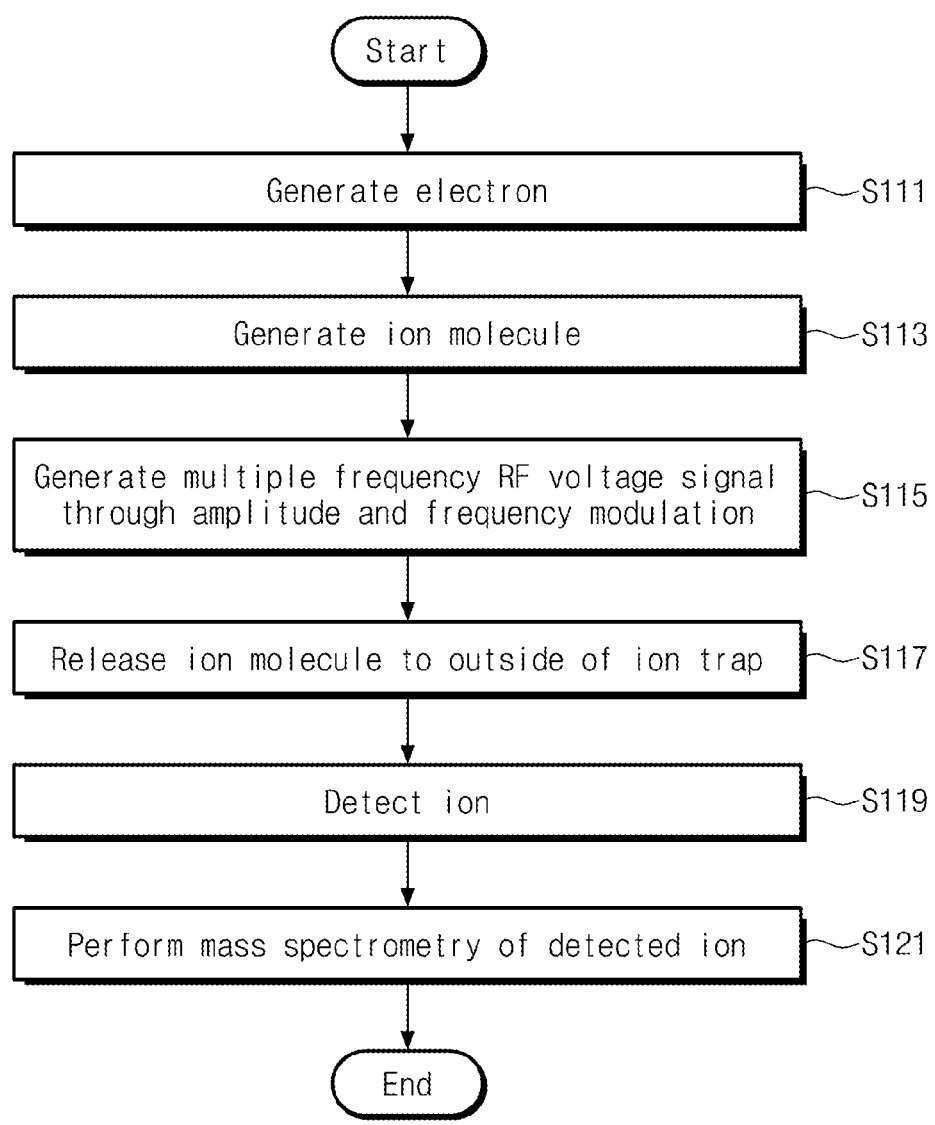
FIG. 3 is a flowchart illustrating a mass analyzing operation of the mass spectrometer shown in FIG. 1.

FIG. 3 is a flowchart illustrating a mass analyzing operation of the mass spectrometer shown in FIG. 1.

Referring to FIG. 3, the electron generator 110 generates electrons used as an ion source in operation S111. The electron generator 110 injects the generated electrons into the inside of the ion trap 120.

The ion trap 120 generates ion molecules as the injected electrons collide with a sample therein in operation S113. Herein, the sample may be already injected into the inside of the ion trap 120 in order for analysis.

The multiple frequency RF amplifier 130 generates a multiple frequency RF voltage signal through amplitude and frequency modulation in operation S115. At this point, the multiple frequency RF amplifier 130 may generate RF signal by modulating the amplitude and frequency of a reference waveform signal. Then, the multiple frequency RF amplifier 130 drive-amplifies the RF signal and generates a multiple frequency RF voltage signal through power amplification.

During the generation of RF signal, after increasing the amplitude of RF signal through amplitude modulation, the multiple frequency RF amplifier 130 may reduce the frequency of the RF signal through frequency modulation. In such a manner, the mass range of the mass spectrometer 100 may be expanded while minimizing the increase of consumption voltage through the amplitude increase and the frequency reduction.

Moreover, the multiple frequency RF amplifier 130 may rectify the waveform of a multiple frequency RF voltage signal and may compensate the waveform of an RF signal on the basis of the rectified waveform.

The multiple frequency RF amplifier 130 outputs the multiple frequency RF voltage signal to the inside of the ion trap 120 to release ion molecules to the outside of the ion trap 120 according to the mass in operation S117.

The detector 140 detects ions released from the ion trap 120 in operation S119.

The data analyzer 150 mass-analyzes the ions detected from the detector 140 in operation S121.

Figure 4:
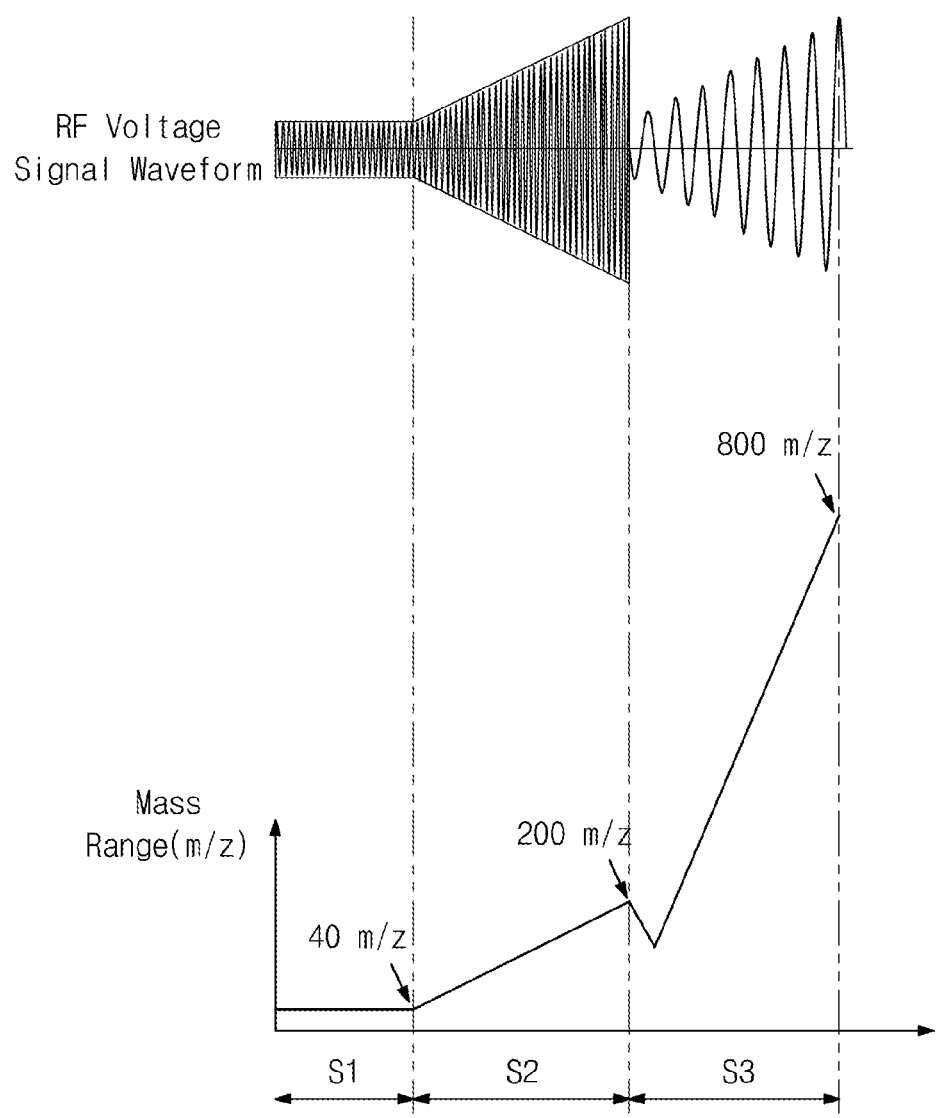
FIG. 4 is a view illustrating a mass range depending on the waveform of an RF voltage signal according to an embodiment of the inventive concept.

FIG. 4 is a view illustrating a mass range depending on the waveform of an RF voltage signal according to an embodiment of the inventive concept.

Referring to FIG. 4, the waveform of an RF voltage signal outputted from the multiple frequency RF amplifier 130 is shown.

In a section S1, the mass spectrometer 100 traps ion molecules in a trap by using an RF voltage signal with a predetermined amplitude. At this point, the mass range of the mass spectrometer 100 traps ion molecules having a mass of more than an about 40 mass to charge ratio (m/z).

In a section S2, the mass spectrometer 100 performs a mass spectrometry by using an RF voltage signal that gradually increases the amplitude. At this point, the mass meter 100 has about 200 m/z at an amplitude having the maximum size.

In a section S3, the mass spectrometer 100 performs a mass spectrometry by using an RF voltage signal that simultaneously modulates the amplitude and the frequency. At this point, the mass range of the mass spectrometer 100 has about 800 m/z at an amplitude having the maximum size.

Below, Table 1 shows a voltage consumed in the mass spectrometer 100 in each section.

TABLE 1

| Section | Frequency | Mass range | Voltage |
|---------|-----------|------------|---------|
| S1 | 2 MHz | 40 m/z | 100 V |
| S2 | 2 MHz | 40 to 200 m/z | 100 to 500 V |
| S3 | 1 MHz | 200 to 800 m/z | 125 to 500 V |

Table 1 shows a frequency used in each section and a mass range. The section S1 uses a frequency of 2 MHz, and the section S2 uses a frequency of 2 MHz, and the section S3 uses a frequency of 1 MHz.

Accordingly, the section S3 corresponds to an operation of the mass spectrometer 100 for simultaneously performing amplitude modulation and frequency modulation suggested from the inventive concept.

A mass range in the section S3 may have a value of about 800 m/z and is four times greater than that in the section S2 having the same amplitude. However, as the mass spectrometer 100 consumes a voltage of about 500 V to generate an actual RF signal in the section S3, the voltage is identical to a voltage (about 500 V) necessary in the section S2 and has a ¼ value of a voltage (about 2000 V) consumed for a mass spectrometry of about 800 m/z in the section S2.

If the frequency is changed to 500 kHz in the section S3, a mass range may be increased to about 3200 m/z.

The multiple frequency RF amplifier 130 used in the mass spectrometer 100 is limited to voltage and frequency in use according to the mechanical structure of the ion trap. However, when a relatively low frequency of several MHz, for example, an about 2 MHz band, is used, there is no difficulty in a matching circuit configuration in a bandwidth of less than 2 MHz. Additionally, although an amplification factor according to a frequency is changed, the multiple frequency RF amplifier 130 may provide software or hardware compensation.

Through this, a mass spectrometer suggested in the inventive concept may minimize the size of an RF amplifier module and power consumption. Therefore, a mass spectrometer may utilize the mass range of a multiple frequency RF amplifier to the maximum within a voltage and frequency band limited range. Also, the inventive concept may provide a portable and low power operable mass spectrometer as mixing amplitude modulation and frequency modulation.

Through this, a mass spectrometer according to an embodiment of the inventive concept, for example, may be utilized for medical examination through the analysis of organic materials occurring during breathing for individual health check. Additionally, a mass spectrometer according to an embodiment of the inventive concept may be utilized for environmental monitoring through the detection of contaminants, environmental hormones, bacteria, and viruses Furthermore, a mass spectrometer according to an embodiment of the inventive concept may be utilized for mass spectrometric analysis besides the above-mentioned fields.

A mass spectrometer including a multiple frequency RF amplifier according to an embodiment of the inventive concept may reduce a power necessary for generating an RF voltage signal provided to an ion trap as simultaneously using amplitude and frequency modulation. Due to this, as power consumption is reduced, a mass spectrometer may be implemented in a portable form.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A multiple frequency Radio Frequency (RF) amplifier comprising:
    a waveform generation circuit configured to generate an RF signal by amplitude and frequency-modulating a reference waveform signal;
    a drive amplifier circuit configured to drive-amplify the RF signal; and
    a power amplifier circuit configured to generate a multiple frequency RF voltage signal through a power amplification of the drive-amplified RF signal and output the multiple frequency RF voltage signal to an ion trap for a mass spectrometry.

2. The multiple frequency RF amplifier of claim 1, further comprising:
    a waveform rectifier circuit configured to rectify a waveform of the power-amplified multiple frequency RF voltage signal; and
    a waveform compensation circuit configured to compensate a waveform of the RF signal outputted from the waveform generation circuit.

3. The multiple frequency RF amplifier of claim 1, wherein the waveform generation circuit increases an amplitude of the RF signal and reduces a frequency of the RF signal to expand a range of the mass spectrometry.

4. A mass spectrometer comprising:
    an electron generator configured to generate an electron used as an ion source;
    a multiple frequency Radio Frequency (RF) amplifier configured to generate a multiple frequency RF voltage signal by simultaneously modulating an amplitude and a frequency of a reference waveform signal;
    an ion trap configured to release an ion molecule generated by colliding the electrode with an injected sample to the outside according to a mass by using the multiple frequency RF voltage signal;
    a detector configured to detect the released ion; and
    a data analyzer configured to mass-analyze the detected ion.

5. The mass spectrometer of claim 4, wherein the multiple frequency RF amplifier comprises:
    a waveform generation circuit configured to generate an RF signal from the reference waveform signal by simultaneously modulating the amplitude and the frequency;
    a drive amplifier circuit configured to drive-amplify the RF signal; and
    a power amplifier circuit configured to generate a multiple frequency RF voltage signal through a power amplification of the drive-amplified RF signal and output the multiple frequency RF voltage signal to the ion trap.

6. The mass spectrometer of claim 5, wherein the multiple frequency RF amplifier comprises:
    a waveform rectifier circuit configured to rectify a waveform of the multiple frequency RF voltage signal; and
    a waveform compensation circuit configured to compensate a waveform of the RF signal outputted from the waveform generation circuit on the basis of the rectified waveform.

7. The mass spectrometer of claim 5, wherein the waveform generation circuit increases an amplitude of the RF signal and reduces a frequency of the RF signal to expand a range of the mass spectrometry.

8. A mass spectrometry method of a mass spectrometer, the method comprising:
    generating an electron used as an ion source;
    generating an ion molecule by colliding an electrode with an injected sample in an ion trap;
    generating a multiple frequency Radio Frequency (RF) voltage signal by modulating an amplitude and a frequency of a reference waveform signal;
    releasing the ion molecule to the outside of the ion trap according to a mass by using the multiple frequency RF voltage signal;
    detecting the released ion; and
    mass-analyzing the detected ion.

9. The method of claim 8, wherein the generating of the multiple frequency RF voltage signal comprises:
    generating an RF signal by amplitude and frequency-modulating a reference waveform signal;
    drive-amplifying the RF signal; and
    generating the multiple frequency RF voltage signal by power-amplifying the drive-amplified RF signal and outputting the multiple frequency RF voltage signal to the ion trap.

10. The method of claim 9, wherein the generating of the RF signal comprises:
    increasing an amplitude of an RF signal through the amplitude modulation; and
    reducing a frequency of an RF signal through the frequency modulation,
    wherein a range of the mass spectrometry is expanded through the amplitude increase and the frequency reduction.

11. The method of claim 9, wherein the generating of the multiple frequency RF voltage signal comprises:
    rectifying a waveform of the multiple frequency RF voltage signal; and
    compensating a waveform of the RF signal on the basis of the rectified waveform.

* * * * *